(12) United States Patent
Chen

(10) Patent No.: US 10,755,885 B2
(45) Date of Patent: Aug. 25, 2020

(54) VACUUM TUBE REAR DEVICE

(71) Applicant: ECHOWELL ELECTRONIC CO., LTD., New Taipei (TW)

(72) Inventor: Hsi-Hsien Chen, Taichung (TW)

(73) Assignee: ECHOWELL ELECTRONIC CO., LTD., New Taipei (TW)

( * ) Notice: Subject to any disclaimer, the term of this patent is extended or adjusted under 35 U.S.C. 154(b) by 239 days.

(21) Appl. No.: 15/950,373

(22) Filed: Apr. 11, 2018

(65) Prior Publication Data

US 2019/0318898 A1 Oct. 17, 2019

(51) Int. Cl.
| | |
|---|---|
| *G01R 1/20* | (2006.01) |
| *H01J 19/78* | (2006.01) |
| *H05K 5/02* | (2006.01) |
| *H03F 3/181* | (2006.01) |
| *H03F 1/30* | (2006.01) |
| *H03F 1/28* | (2006.01) |
| *H05K 1/18* | (2006.01) |
| *H05K 1/14* | (2006.01) |
| *G01R 31/28* | (2006.01) |
| *H05K 5/03* | (2006.01) |
| *H04R 29/00* | (2006.01) |

(52) U.S. Cl.
CPC ............ *H01J 19/78* (2013.01); *G01R 31/2825* (2013.01); *H03F 1/28* (2013.01); *H03F 1/30* (2013.01); *H03F 3/181* (2013.01); *H05K 1/141* (2013.01); *H05K 1/181* (2013.01); *H05K 5/0213* (2013.01); *H05K 5/03* (2013.01); *G01R 1/20* (2013.01); *H03F 2200/03* (2013.01); *H04R 29/00* (2013.01); *H05K 2201/049* (2013.01); *H05K 2201/1003* (2013.01); *H05K 2201/10545* (2013.01)

(58) Field of Classification Search
CPC ....... H05K 5/0213; H05K 2201/10545; G01R 1/20
See application file for complete search history.

(56) References Cited

U.S. PATENT DOCUMENTS

| | | | | |
|---|---|---|---|---|
| 4,644,289 | A * | 2/1987 | Kennedy | H03G 3/22 330/118 |
| 5,724,234 | A * | 3/1998 | Phelps | H05K 9/0026 174/357 |
| 9,203,365 | B1 * | 12/2015 | Milbert | H03F 5/00 |
| 9,685,917 | B1 * | 6/2017 | Wun | H03F 3/181 |

(Continued)

*Primary Examiner* — Alvaro E Fortich
(74) *Attorney, Agent, or Firm* — Locke Lord LLP; Tim Tingkang Xia, Esq.

(57) ABSTRACT

The present invention provides a device with rear-mounted vacuum tubes, comprising a protective cover with a plurality of heat dissipating holes, a rear panel with a panel opening, and at least one vacuum tube, wherein the vacuum tubes are arranged in a containing space of the protective cover through the panel opening and inserted to a connection circuit board for coupling to a printed circuit board. In addition, the protective cover, the rear panel, and the vacuum tubes are placed in parallel with the printed circuit board, so that heat dissipation for the device is improved and replacement and maintenance of the vacuum tubes are easier. In particular, a vacuum tube audio amplifier apparatus having the device with rear-mounted vacuum tubes as disclosed herein can be stacked.

12 Claims, 9 Drawing Sheets

(56) References Cited

U.S. PATENT DOCUMENTS

| | | | | |
|---|---|---|---|---|
| 2010/0033245 A1* | 2/2010 | Arrowsmith | ............. | H03F 1/30 |
| | | | | 330/129 |
| 2011/0075359 A1* | 3/2011 | Field | ........................ | G10H 1/32 |
| | | | | 361/695 |
| 2013/0027272 A1* | 1/2013 | Karthaus | .................. | H01Q 7/00 |
| | | | | 343/850 |
| 2017/0104574 A1* | 4/2017 | Hahn | ........................ | H04B 1/44 |

\* cited by examiner

VACUUM TUBE REAR DEVICE

BACKGROUND OF THE INVENTION

Field of the Invention

The present invention relates to a device with rear-mounted vacuum tubes, and more particularly, to a device with rear-mounted vacuum tubes where such devices can be stacked up.

Description of the Prior Art

Vacuum tube audio amplifiers can give very good and pleasant sounds. However, as these amplifiers are generally expensive, bulky and tend to have heat dissipation problems, they are typically designed as high-end products that are still impossible to become common household products. Compared with integrated circuit (digital) audio amplifiers, which are now more popular, vacuum tube audio amplifiers tend to consume larger space with fragile tubes; moreover, when operating, they generate intense heat while the high current is flowing through the filaments within the vacuum tubes. Thus, most of the vacuum tube audio amplifiers are designed to have top-mounted (mostly in high-end type products) or internally mounted vacuum tubes.

FIG. 1 is a cutaway view showing a prior art vacuum tube speaker device 1 (with internally mounted vacuum tubes) and the internal parts thereof. A wooden housing 13 is designed to enclose a prior art vacuum tube amplifier and probably a speaker in the device. The housing 13 can protect vacuum tubes 11 and 12 from colliding with one another and prevent the user from being scalded by the vacuum tubes 11 and 12 when they are operating and generating intense heat. However, the housing 13 makes it difficult for the vacuum tube amplifier to dissipate heat. As a result, the main drawback with the design of an audio device with internally mounted vacuum tubes is its heat dissipation problems; poor heat dissipation will shorten the lifespan of vacuum tubes. In addition, this prior art vacuum tube amplifier includes a metal grounding plate 10 at the bottom part, arranged close to the circuit of the amplifier to reduce the noise generated from the circuit when operating. However, such arrangement causes the prior art vacuum tube amplifier to consume a lot of space and become very bulky. If testing operations need to be carried out, the vacuum tube amplifier with the above design will have to wait until it is assembled with the housing 13 of the speaker device 1. The testing operations for the whole audio system cannot be performed until the vacuum tube amplifier and the housing are assembled together. The bulky device is thus disadvantageous for establishing an automation production line that includes a testing procedure.

FIG. 2 shows another prior art vacuum tube audio amplifier apparatus 20 (with top-mounted vacuum tubes), which can be separate from speakers to improve heat dissipation. As shown in the drawing, protective frames 23 are used to provide simple protection for vacuum tubes 11 and 12. Still, the vacuum tube audio amplifier apparatus 20 includes a metal grounding plate 10 (may be a metal housing) at the bottom part for reducing noise; moreover, the apparatus 20 needs to be connected to an external speaker device and thus the whole audio system will consume even more space. In addition, the vacuum tube audio amplifier apparatus 20 has the vacuum tubes 11 and 12 arranged on the top of the device to facilitate heat dissipation and system configurations. However, such design makes it impossible for the devices to be stacked up on one another like integrated circuit (digital) audio amplifiers, thus making them impossible to become common household products. Also, as the circuit board of the amplifier is positioned within the apparatus housing while the vacuum tubes are positioned on top of the apparatus housing, testing operations are difficult to be carried out with the non-modular design. Similarly, the testing operations for the whole audio system cannot be performed until the vacuum tube amplifier apparatus 20 is completely assembled, and the bulky device is disadvantageous for establishing an automation production line that includes a testing procedure.

SUMMARY OF THE INVENTION

As described above, prior art vacuum tube audio amplifiers have drawbacks associated with space consumption, stacking and heat dissipation, and thus the materials used for them could be restricted (therefore with high costs). In view of the above problems, the present invention provides a device with rear-mounted vacuum tubes, wherein the device can be arranged in a vacuum tube audio amplifier apparatus. The device with rear-mounted vacuum tubes comprises a rear panel, a front panel and a housing. The housing is assembled with the front and rear panels along the horizontal direction. The vacuum tubes are arranged, through an opening of the rear panel, from the inside to the outside of the device, and mounted at the rear of a vacuum tube audio amplifier apparatus; thus, the heat generated by the vacuum tubes can be dissipated to the outside of the device (i.e., into the air). The device with rear-mounted vacuum tubes can be used in a vacuum tube audio amplifier apparatus. The device according to the present invention allows the amplifier apparatuses to be vertically stacked and facilitates mass production of the amplifier apparatuses. In addition, the device with rear-mounted vacuum tubes according to the present invention can achieve the objective of reducing the cost for the machine housing. As the vacuum tubes are located at the rear of the machine, heat dissipation can be improved and the lifespan of vacuum tubes can be prolonged, which, in turn, is favorable for the selection of the machine housing (selection of the materials will not be restricted in order to address the thermal endurance problem). Heat resistance is no longer a problem, and virtually all housing materials can be used, such as PVC veneers or plastic housings which are of lower cost.

In addition, the device with rear-mounted vacuum tubes according to the present invention can reduce the residual noise related to power supply and grounding, thereby eliminating the humming sound effectively; moreover, a metal grounding plate at the bottom part is not needed. Please also refer to Taiwanese Patent Application No. 106129734 for relevant techniques; said application discloses that reducing the size of a vacuum tube amplifier apparatus can avoid leakage currents.

To address the problems described above, the present invention provides a device with a rear-mounted vacuum tube, the device comprising at least one protective cover, a rear panel and at least one PCB, wherein: the at least one protective cover comprises a plurality of heat dissipation holes, a containing space and an opening edge; the rear panel comprises at least one rear panel opening, the opening edge being joined to the rear panel opening; and the at least one PCB is electrically connected to at least one vacuum tube. Moreover, the PCB is mounted to the rear panel opening, so that the vacuum tube is arranged within the containing space of the protective cover.

The present invention further provides a device with a rear-mounted vacuum tube, the device comprising a plurality of protective covers, a rear panel and a plurality of PCBs, wherein: each of the protective covers comprises a plurality of heat dissipation holes, a containing space and an opening edge; the rear panel comprises a plurality of rear panel openings, the opening edge of each protective cover being joined to a corresponding rear panel opening; and each of the PCBs is configured with at least one vacuum tube. Moreover, each of the PCBs is mounted to a corresponding rear panel opening of the rear panel, so that the vacuum tube electrically connected to each PCB is arranged within the containing space of a corresponding protective cover.

DETAILED DESCRIPTION OF THE PREFERRED EMBODIMENTS

Figure 1:
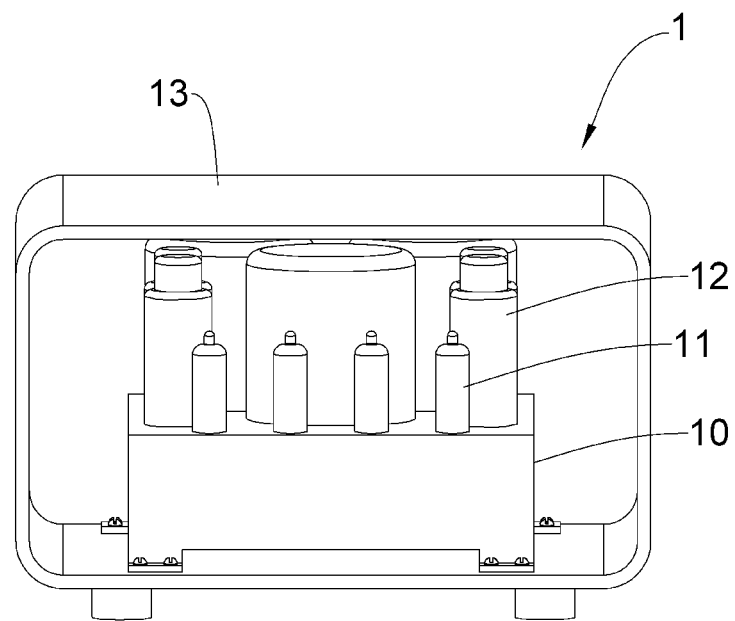
FIG. 1 is a cutaway view showing a prior art vacuum tube speaker device (with internally mounted vacuum tubes) and the internal parts thereof.
Figure 2:
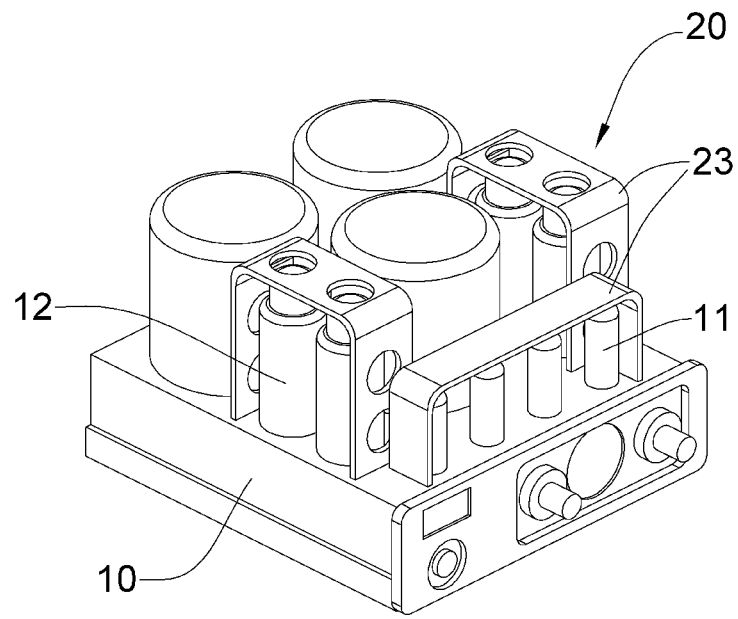
FIG. 2 is a perspective view of a prior art vacuum tube audio amplifier apparatus (with top-mounted vacuum tubes).
Figure 3A:
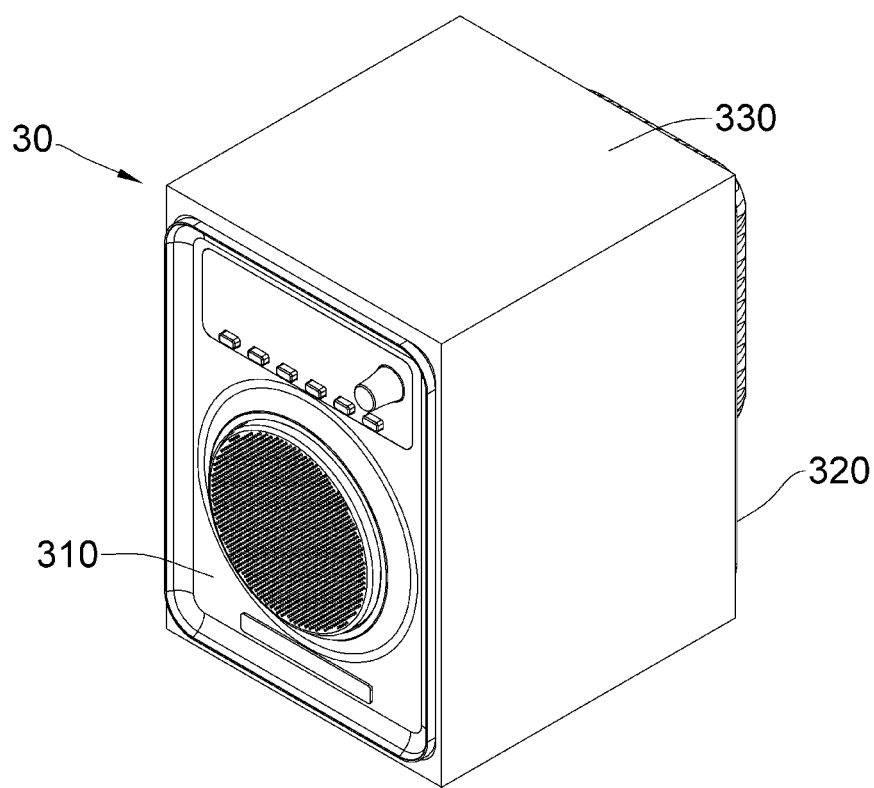
FIG. 3A is a front perspective view of a device with rear-mounted vacuum tubes according to an embodiment of the present invention.

FIG. 3A is a front perspective view of a device 30 with rear-mounted vacuum tubes according to an embodiment of the present invention. The device 30 with rear-mounted vacuum tubes is formed by assembling a housing 330 with a front panel 310 and a rear panel 320. The front panel 310 may comprise an operation panel on which means for adjusting the settings of a stereo by the user may be provided, such as keys or knobs in any form, or any touchable/untouchable buttons. Alternatively, the device 30 with rear-mounted vacuum tubes may comprise a speaker on the front panel 310.

Figure 3B:
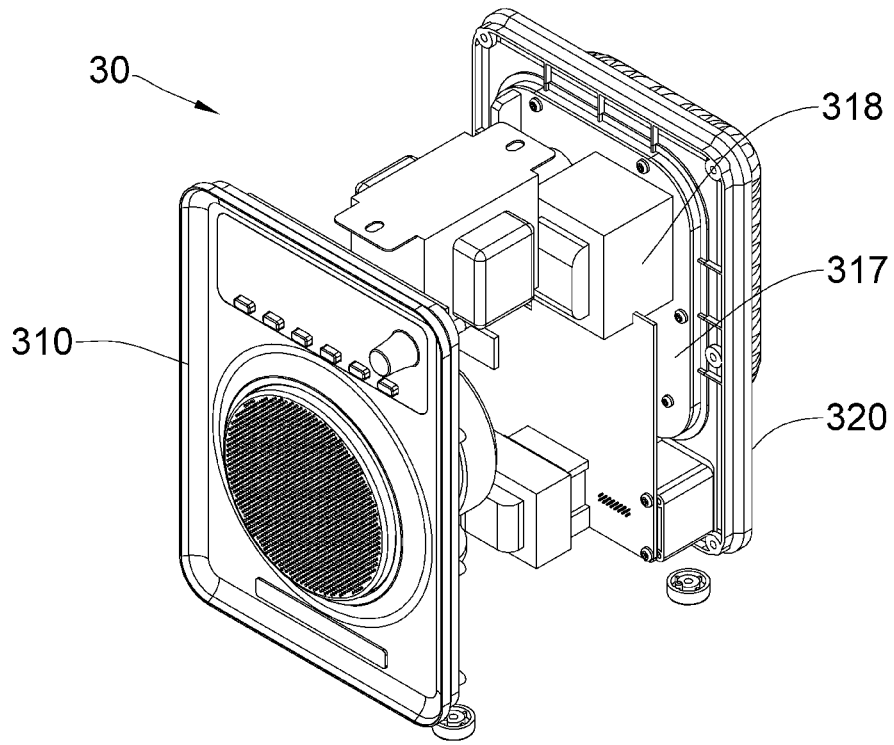
FIG. 3B is a cutaway view showing the internal parts of the device with rear-mounted vacuum tubes as illustrated in FIG. 3A.

FIG. 3B is a cutaway view showing the internal parts of the device with rear-mounted vacuum tubes as illustrated in FIG. 3A. It can be seen that within the housing 330, a PCB (printed circuit board) 317 is placed vertically near the rear panel 320 of the device 30. The PCB 317 may be a multilayer PCB, consisting of multiple layers that form the circuit of a vacuum tube audio amplifier. In particular, all or most of the circuit components are inserted or connected to the PCB 317; by doing so, the space required by the audio system can be reduced, the minimum trace width can be obtained, and the circuit performance can be improved. In addition, the device 30 with rear-mounted vacuum tubes according to the present invention can be formed without a metal grounding plate at the bottom part.

Figure 4A:
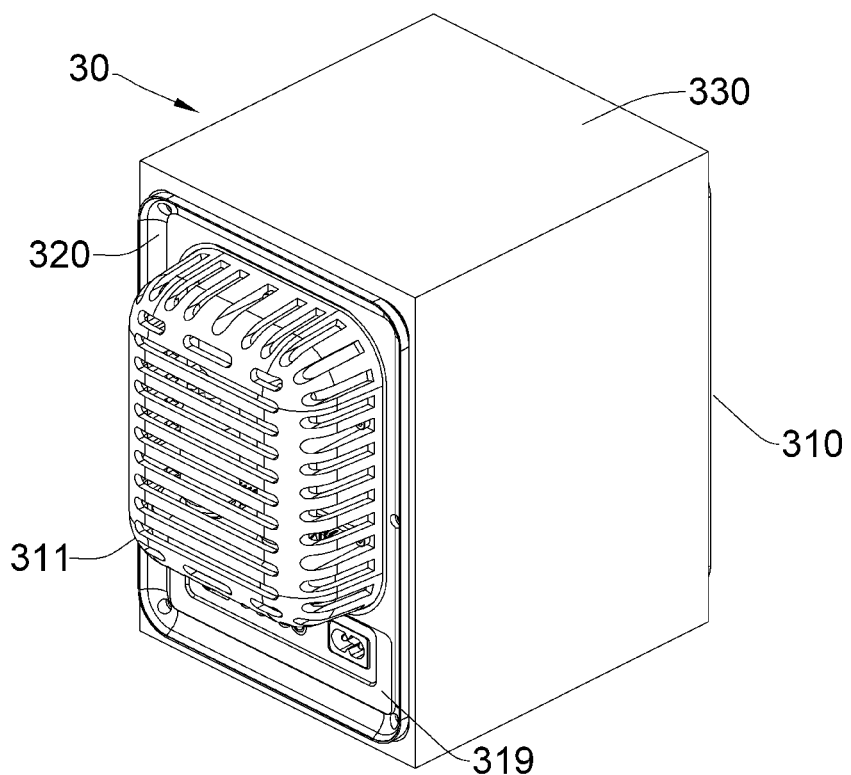
FIG. 4A is a rear perspective view of a device with rear-mounted vacuum tubes according to an embodiment of the present invention.

FIG. 4A is a rear perspective view of a device 30 with rear-mounted vacuum tubes according to the present invention. The rear panel 320 of the device 30 may include a protective cover 311. If a protective cover 311 is included, the device 30 with rear-mounted vacuum tubes will extend out of the containing space defined by the housing 330. Moreover, the protective cover 311 comprises a plurality of holes, which help dissipate the intense heat generated by the vacuum tubes when operating; as a result, the intense heat can be directly dissipated out of the device 30. In this way, heat can be dissipated effectively, and therefore, accumulation of intense heat inside the housing, which may impair circuit performance, can be avoided. In addition, the rear panel 320 may comprise an I/O module that can contain terminals in any form, so that signals or power can be received or output by the device 30 with rear-mounted vacuum tubes.

Figure 4B:
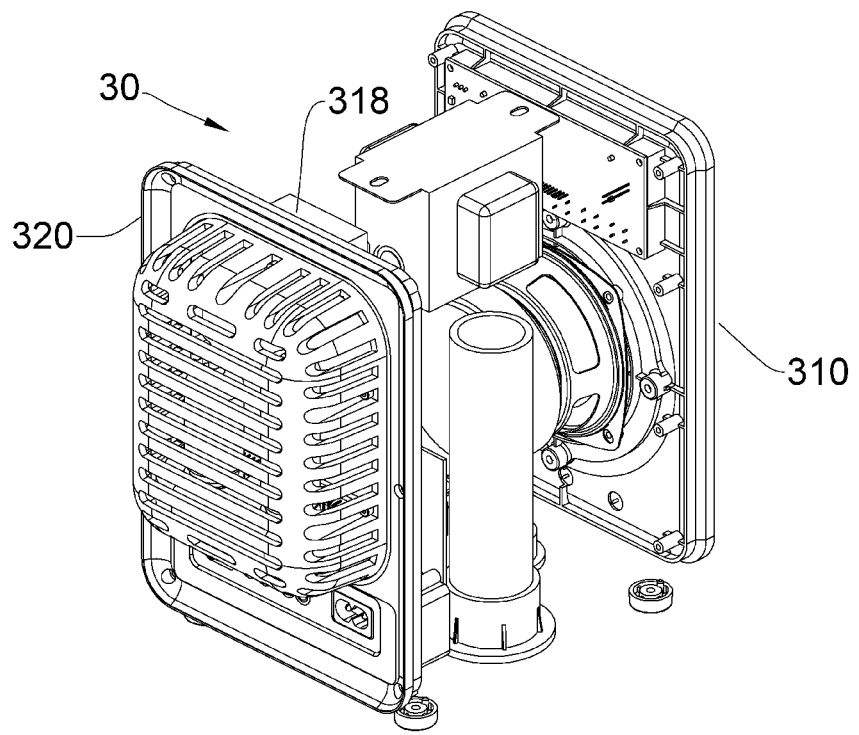
FIG. 4B is a cutaway view showing the internal parts of the device with rear-mounted vacuum tubes as illustrated in FIG. 4A.

FIG. 4B is a cutaway view showing the internal parts of the device 30 with rear-mounted vacuum tubes as illustrated in FIG. 4A. It can be seen that for the device 30, the major components of the circuit are positioned near the rear panel 320. Meanwhile, the vacuum tubes are arranged (by placing the tubes through an opening of the rear panel 320) in an area protruding from the rear panel 320 (i.e., outside the containing space defined by the housing 330). Thus, the circuit components can be inserted and connected to the vertically positioned PCB to reduce the space consumed by the circuit of the device with rear-mounted vacuum tubes. By concentrating the circuit components near the rear panel 320, heat dissipation can be carried out more effectively for the vacuum tubes and the circuit; in consequence, impaired performance of the circuit due to intense heat can be avoided.

Please refer to both FIG. 3B and FIG. 4B. It can be seen that a (audio) transformer and the vacuum tubes (inside the protective cover) are arranged at opposite sides of the PCB. This arrangement can help reduce the trace width; also, it can prevent the vacuum tubes and the transformer 318 (e.g., a standby transformer) from affecting one another when operating, thereby achieving the result of noise reduction. In addition, the device 30 with rear-mounted vacuum tubes can be stacked vertically.

Figure 5A:
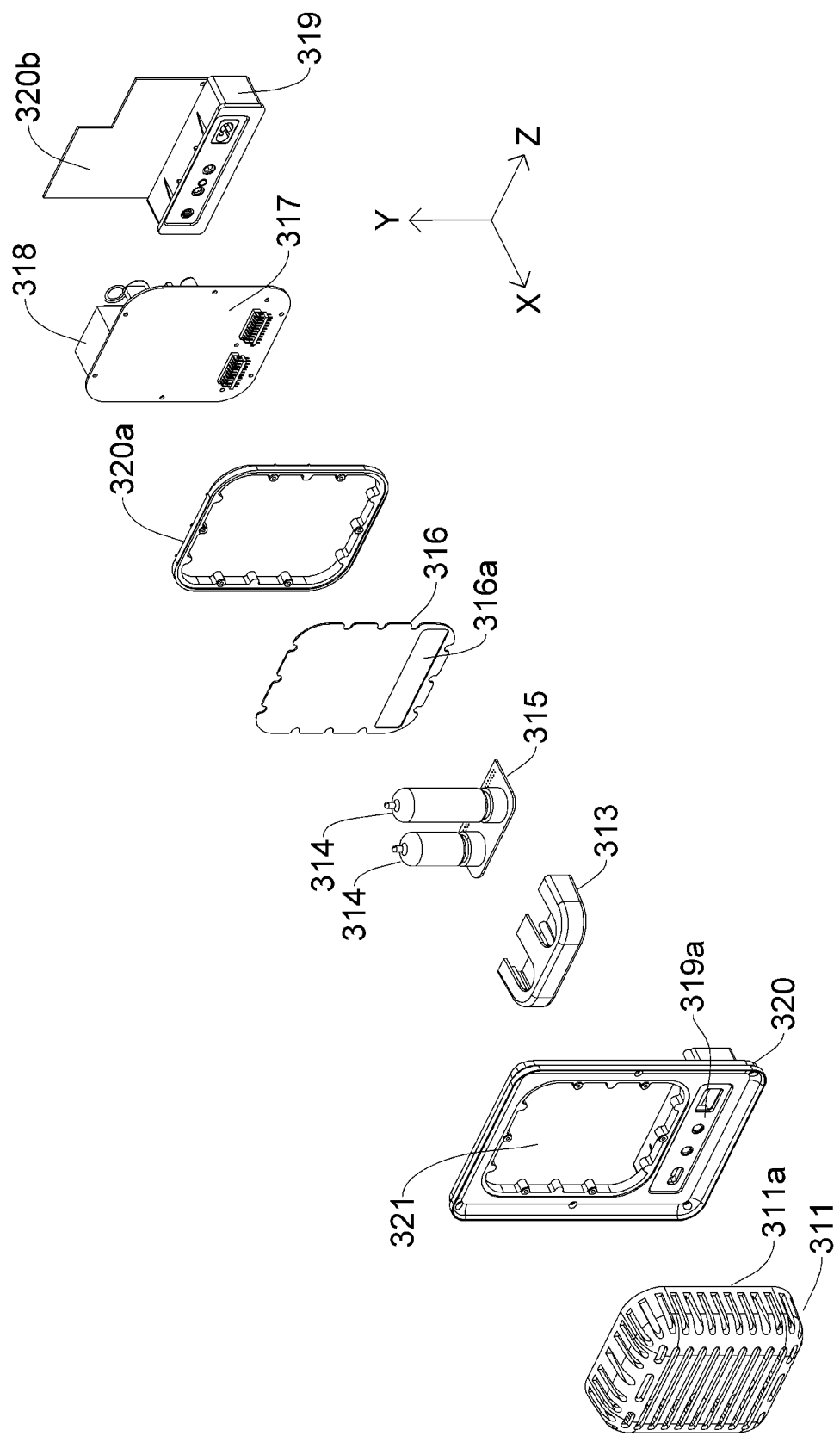
FIG. 5A is an exploded view of a device with rear-mounted vacuum tubes according to an embodiment of the present invention.

FIG. 5A is an exploded view of a device 30 with rear-mounted vacuum tubes according to the present invention. The device 30 does not include a metal grounding plate at the bottom part, but comprises at least a protective cover 311, a rear panel 320, a protective carrier 313, vacuum tubes 314, a connection circuit board 315, an insulating plate 316, a PCB 317, a transformer 318, and an I/O module 310. The above-described elements shown in FIG. 5A are closer to the rear panel 320 than to the front panel 310.

All of the above-described elements shown in FIG. 5A are assembled to the rear panel 320 along the X-direction (i.e., the normal line to the plane of the PCB 317); methods for assembling them include but are not limited to using snap fits or screws to fasten the elements. Moreover, the protective cover 311 (and its opening edge 311a), the rear panel 320, the insulating plate 316, the plane of the PCB 317, and the central tubular axis of each vacuum tube 314 are all arranged parallel to the Y-direction (i.e., the direction parallel to the plane/surface of the PCB 317); the connection circuit board 315 is arranged parallel to the X-direction; and the two vacuum tubes 314 are arranged along the Z-direction.

The rear panel 320 comprises a panel opening 321 and an I/O module fitting portion 319a. The panel opening 321 is joined to the opening edge 311a of the protective cover 311, which comprises a plurality of holes to facilitate heat dissipation. Also, the surfaces of the protective cover 311 and the opening edge 311a define a containing space, which, at the least, can be used to accommodate the vacuum tubes 314. Thus, if the vacuum tubes 314 are placed in the containing space of the protective cover 311 through the panel opening 321, heat can be dissipated from the containing space and enter into the air outside the device 30. In this way, the intense heat generated by the vacuum tubes when operating will not stay in the internal space defined by the housing of the device 30. Additionally, the I/O module fitting portion 319a can be joined to the I/O module 319.

The vacuum tubes 314 are first inserted and connected to the connection circuit board 315 vertically (in the Y-direction); then, the connection circuit board 315 is perpendicularly inserted and connected to the PCB 317, allowing the vacuum tubes 314 to be coupled to the PCB 317. In addition, to assure more solid connections among the vacuum tubes 314, the connection circuit board 315 and the PCB 317, the protective carrier 313 can be used for fitting to the connection circuit board 315, thereby enclosing the connecting part between the vacuum tubes 314 and the connection circuit board 315, as well as the connecting point between the connection circuit board 315 and the PCB 317. The configuration of the protective carrier 313 is intended to maintain good electrical connection for the vacuum tubes 314 when the device 30 undergoes shaking or vibrations (for example, when the device is placed on a production line conveyor belt that is moving).

There is also an insulating plate 316 adhered to the PCB 317, and thus, the insulating plate 316 is positioned between the vacuum tubes 314 and the PCB 317. Accordingly, the insulating plate 316 comprises an opening 316a, and the vacuum tubes 314 connected to the connection circuit board 315 can be inserted and connected to the PCB 317 through the opening 316a. This allows the user to connect/disconnect the vacuum tubes 314 and the connection circuit board 315 without touching the nodes (soldering points) on the PCB 317, thereby preventing the occurrence of short circuits. The use of the insulating plate 316 described herein is only exemplary and non-limiting; an insulation adhesive or insulating film may be used to cover on the PCB 317 as a substitute for the insulating plate 316.

The connection circuit board 315 is inserted and connected to one side of the PCB 317; on the opposite side of the PCB 317, a transformer 318 is positioned. The above arrangement can help reduce the trace width. The PCB 317 may alternatively comprise a grounding layer to achieve the result of noise reduction.

Further, the rear panel 320 may comprise supporting members 320a and 320b for supporting the protective cover 311, the vacuum tubes 314, and the PCB 317. The supporting members can facilitate assembling the above-described elements to the rear panel 320, and can support or secure these elements after the assembling operation is finished. The supporting members 320a, 320b may be integrally formed with the rear panel 320. The configuration of the supporting members 320a and 320b is intended to form a test module by directly assembling and securing the protective cover 311, the vacuum tubes 314, the connection circuit board 315, the insulating plate 316, the PCB 317, and the transformer 318 to the rear panel 320. The assembled test module will allow the testing operations to be carried out more easily during the manufacturing process, since the testing operations will not be limited to the space within the device housing. Additionally, the test module may further include the I/O module 319 by joining it to the I/O module fitting portion 319a.

Figure 5B:
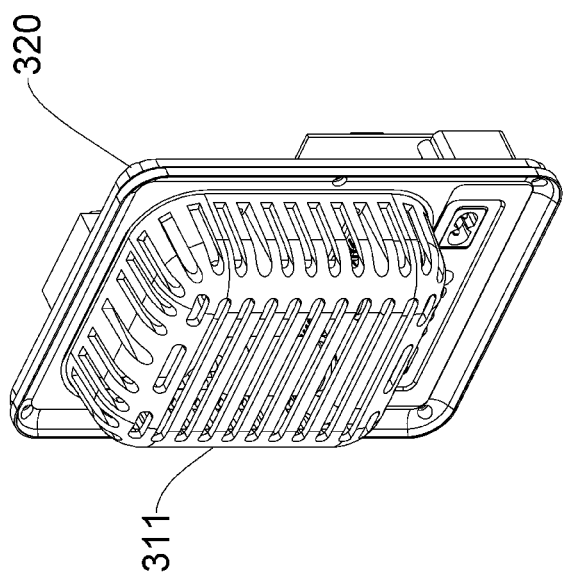
FIG. 5B is an assembled view of the device with rear-mounted vacuum tubes according to an embodiment of the present invention.

FIG. 5B is an assembled view of the device 30 with rear-mounted vacuum tubes according to an embodiment of the present invention. After the assembly of the device is completed, the vacuum tubes 314 are positioned inside the containing space of the protective cover 311 and outside the containing space of the device housing. Also, the above-described elements are close to and secured to the rear panel 320, making it easier to carry out testing operations directly to the assembled device during the manufacturing process.

The above-described arrangement according to the present invention not only facilitates heat dissipation, but also facilitates replacement of the vacuum tubes 314 by the user or a device supplier. By removing the protective cover 311 and the protective carrier 313, the vacuum tubes 314 can be taken out and replaced directly; it is not necessary to remove the larger device housing.

In addition, as the vacuum tubes 314 are arranged on the rear panel 320 along the X-direction, the device 30 can be stacked along the Y-direction.

Figure 6A:
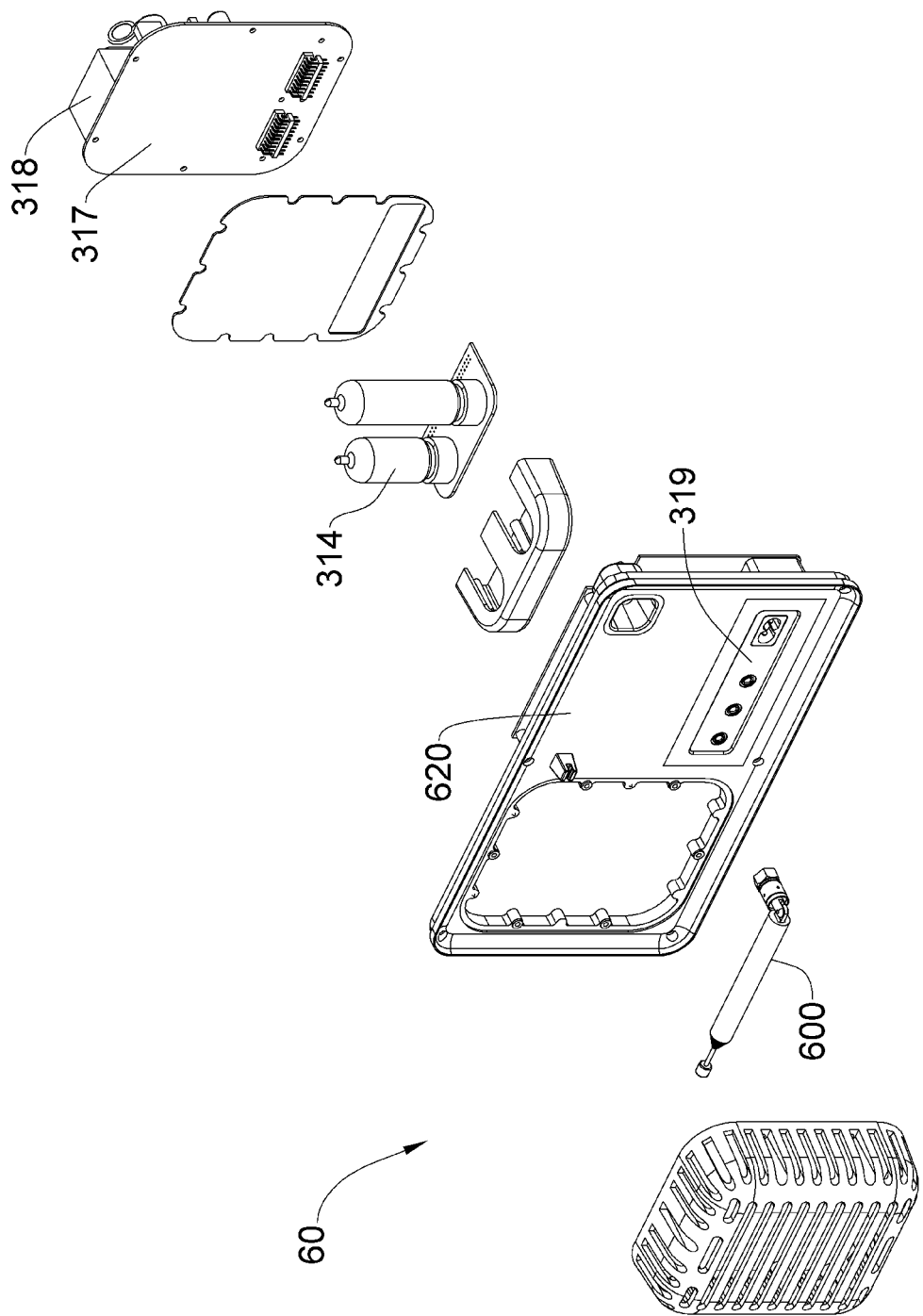
FIG. 6A is an exploded view of a device with rear-mounted vacuum tubes according to another embodiment of the present invention.
Figure 6B:
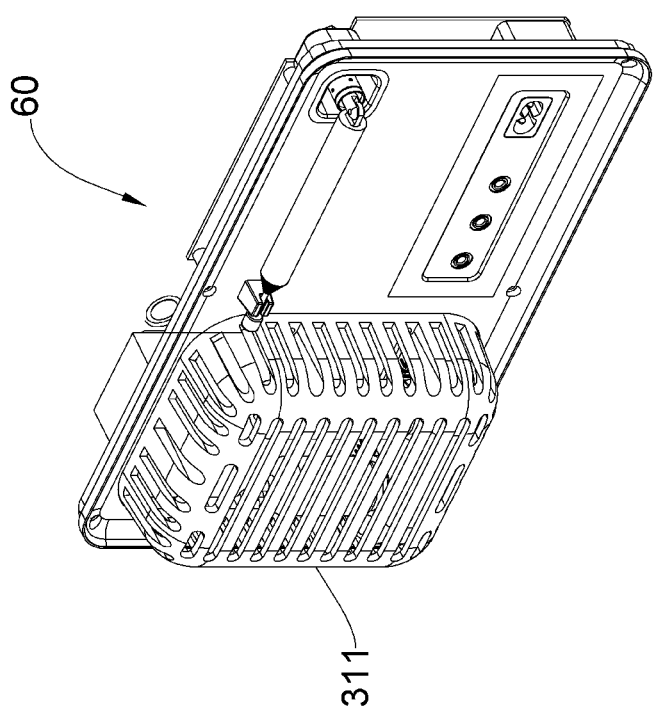
FIG. 6B is an assembled view of the device with rear-mounted vacuum tubes according to another embodiment of the present invention.

FIG. 6A is an exploded view of a device 60 with rear-mounted vacuum tubes according to another embodiment of the present invention. The device 60 does not include a metal grounding plate at the bottom part. To satisfy different application needs, the device 60 with rear-mounted vacuum tubes further comprises an antenna element 600; also, the layout of a rear panel 620 is slightly altered, but the directions in which the elements are placed are basically the same as in FIG. 5A. FIG. 6B is an assembled view of the device 60 with rear-mounted vacuum tubes according to the present invention. Similarly, this arrangement not only facilitates heat dissipation, but also facilitates replacement of the vacuum tubes 314 by the user or a device supplier. Removing the larger device housing is not needed.

Figure 7A:
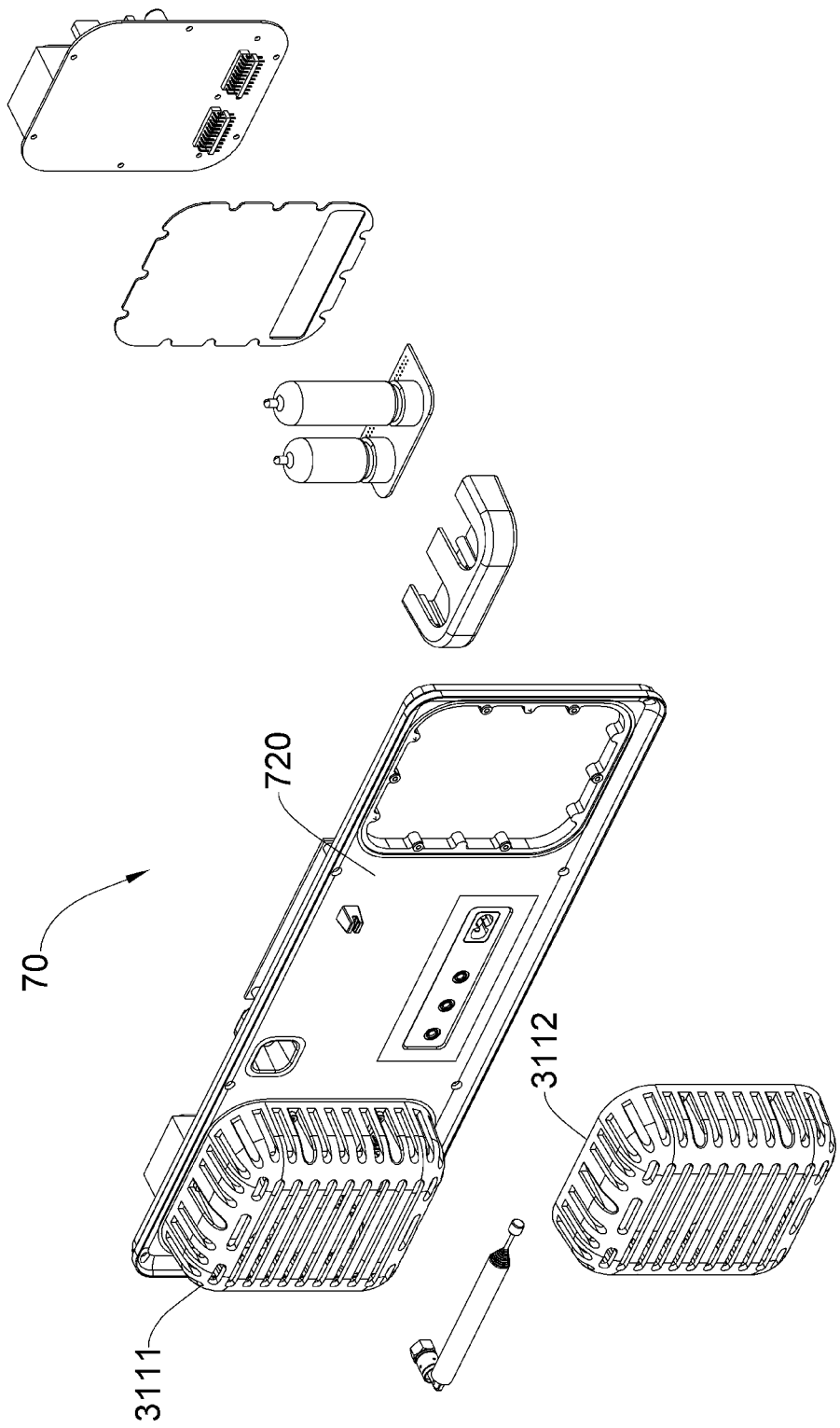
FIG. 7A is an exploded view of a device with rear-mounted vacuum tubes according to yet another embodiment of the present invention.

According to the present invention, the number of each element, such as the number of the vacuum tube, the protective cover and the PCB, can increase depending on the circuit needs of the device with rear-mounted vacuum tubes. FIG. 7A is an exploded view of a device 70 with rear-mounted vacuum tubes according to yet another embodiment of the present invention. The device 70 does not include a metal grounding plate at the bottom part and comprises two protective covers 3111 and 3112, each protecting two vacuum tubes. Thus, the rear panel 720 comprises two panel openings.

Figure 7B:
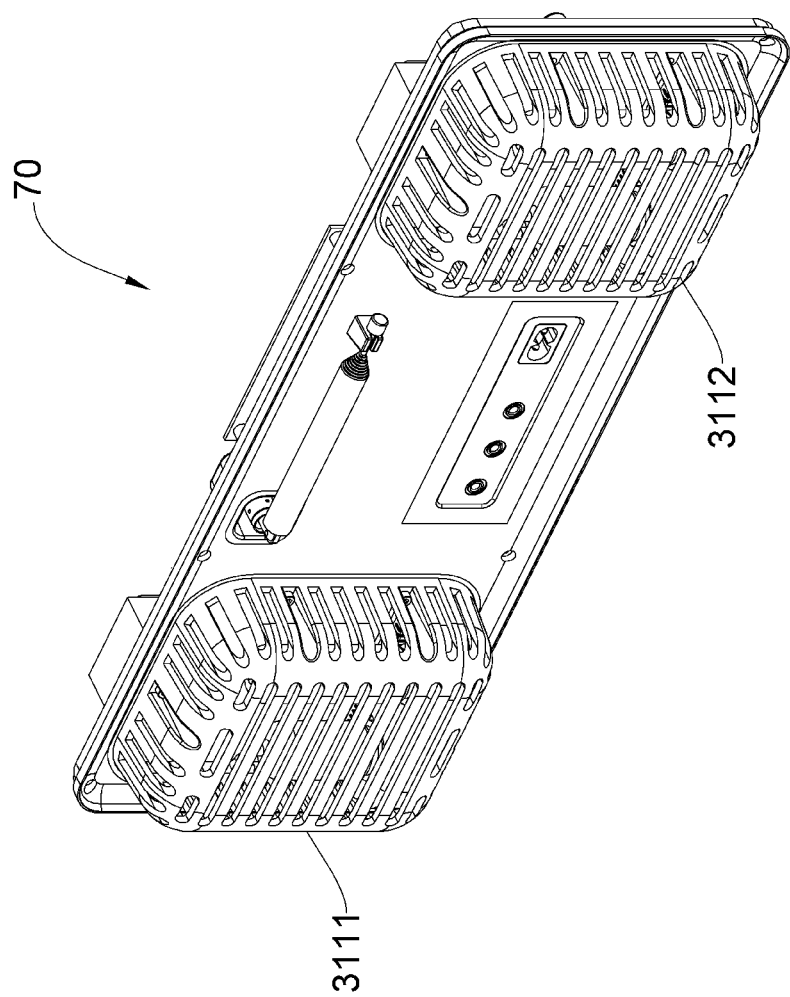
FIG. 7B is an assembled view of the device with rear-mounted vacuum tubes according to yet another embodiment of the present invention.

FIG. 7B is an assembled view of the device 70 with rear-mounted vacuum tubes according to the present invention. The arrangement of two protective covers 3111 and 3112 not only facilitates heat dissipation, but also facilitates replacement of the vacuum tubes 314 by the user or a device supplier. Removing the larger device housing is not needed.

The above disclosure of the present invention is meant to be exemplary and illustrative, not limiting in scope. For example, the number of each element is not limited to that described above. There may be one protective cover protecting one or more vacuum tubes, while one or more PCBs are used. Such arrangements are also within the scope of the present invention.

What is claimed is:

1. A device with a rear-mounted vacuum tube, comprising:
   at least one protective cover comprising a plurality of heat dissipation holes, a containing space and an opening edge;
   a rear panel comprising at least one rear panel opening, the opening edge being joined to the rear panel opening;
   at least one PCB (printed circuit board) electrically connected to at least one vacuum tube; and
   a transformer electrically connected to the at least one PCB, wherein the transformer and the at least one vacuum tube are arranged at opposite sides of the at least one PCB;
   wherein the at least one PCB is mounted to the rear panel opening, so that the at least one vacuum tube is arranged within the containing space of the at least one protective cover.

2. The device of claim 1, wherein the device does not include a metal grounding plate at a bottom part.

3. The device of claim 1, further comprising an insulating plate, wherein the insulating plate is arranged between the at least one vacuum tube and the at least one PCB, and is adhered to the at least one PCB.

4. The device of claim 1, further comprising a connection circuit board electrically connected to the at least one PCB, wherein the at least one vacuum tube is inserted and connected to the connection circuit board.

5. The device of claim 4, further comprising a securing carrier enclosing a connecting part where the connection circuit board and the at least one vacuum tube are attached.

6. The device of claim 1, wherein the rear panel comprises an I/O module.

7. The device of claim 1, wherein the at least one protective cover, the at least one vacuum tube and the at least one PCB are secured to the rear panel and assembled to form a test module.

8. The device of claim 7, further comprising a front panel and a housing, wherein a normal line to a plane of the at least one PCB is defined as a first direction, and the housing is assembled with the front panel and the test module along the first direction, so that a top of the housing enables other devices being stacked thereon.

9. A device with a rear-mounted vacuum tube, comprising:
   a plurality of protective covers, each of the protective covers comprising a plurality of heat dissipation holes, a containing space and an opening edge;
   a rear panel comprising a plurality of rear panel openings, the opening edge of each of the protective covers being joined to a corresponding one of the rear panel openings; and
   a plurality of printed circuit boards, each of the printed circuit boards configured with at least one vacuum tube,
   wherein each of the printed circuit boards is mounted to a corresponding one of the rear panel openings of the rear panel, so that the at least one vacuum tube electrically connected to the corresponding one of the printed circuit boards is arranged within the containing space of a corresponding one of the protective covers,
   wherein each of the protective covers, the rear panel and a corresponding one of the printed circuit boards are assembled to form a test module.

10. The device of claim 9, wherein the device does not include a metal grounding plate at a bottom part.

11. The device of claim 9, further comprising a plurality of connection circuit boards, wherein each of the connection circuit boards is electrically connected to a corresponding one of the printed circuit boards, and the at least one vacuum tube configured with the corresponding one of the printed circuit boards is inserted and connected to the corresponding one of the connection circuit boards.

12. The device of claim 9, further comprising a front panel and a housing, wherein a normal line to a plane of one of the printed circuit boards is defined as a first direction, and the housing is assembled with the front panel and the test module along the first direction, so that a top of the housing enables other devices being stacked thereon.

* * * * *